United States Patent
Yun

(10) Patent No.: US 7,026,246 B2
(45) Date of Patent: Apr. 11, 2006

(54) METHOD OF CLEANING SEMICONDUCTOR SUBSTRATES AFTER FORMING TUNGSTEN PATTERNS

(75) Inventor: Cheol-Ju Yun, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 53 days.

(21) Appl. No.: 10/294,683

(22) Filed: Nov. 15, 2002

(65) Prior Publication Data

US 2003/0109145 A1    Jun. 12, 2003

(30) Foreign Application Priority Data

Dec. 10, 2001    (KR) ............................... 2001-77809

(51) Int. Cl.
*H01L 21/461*    (2006.01)

(52) U.S. Cl. ........................................ 438/693; 134/1.2

(58) Field of Classification Search ................ 438/693; 134/1.2, 1.3

See application file for complete search history.

(56) References Cited

U.S. PATENT DOCUMENTS

| | | | |
|---|---|---|---|
| 6,162,301 A * | 12/2000 | Zhang et al. ................... 134/3 |
| 6,387,190 B1 * | 5/2002 | Aoki et al. .................... 134/28 |
| 6,423,148 B1 * | 7/2002 | Aoki .............................. 134/3 |
| 6,537,916 B1 * | 3/2003 | Mullee et al. ............... 438/692 |
| 6,664,196 B1 * | 12/2003 | Wada et al. ................. 438/754 |
| 6,727,187 B1 | 4/2004 | Takeshima et al. |
| 6,733,597 B1 * | 5/2004 | Wu et al. ...................... 134/26 |
| 6,767,409 B1 * | 7/2004 | Aoki et al. .................... 134/28 |
| 2005/0199264 A1* | 9/2005 | Andreas ......................... 134/2 |

FOREIGN PATENT DOCUMENTS

| JP | 2000-173959 | * 6/2000 |
|---|---|---|
| KR | 2001-0098862 | 11/2001 |

* cited by examiner

*Primary Examiner*—W. David Coleman
(74) *Attorney, Agent, or Firm*—Lee & Morse, P.C.

(57) ABSTRACT

A method of forming a semiconductor device that includes cleaning a substrate after forming a tungsten pattern thereon, comprises forming a tungsten layer on a substrate, etching the tungsten layer to form a tungsten pattern, and performing a cleaning process on the substrate having the tungsten pattern using a cleaning solution of a water solution containing 0.1 to 0.4 wt % fluoric acid and 0.5 to 2 wt % hydrogen peroxide. By using the method of the present invention, metal polymers and oxidized slurry residue generated while forming the tungsten pattern may be completely removed without attacking the tungsten pattern.

7 Claims, 4 Drawing Sheets

METHOD OF CLEANING SEMICONDUCTOR SUBSTRATES AFTER FORMING TUNGSTEN PATTERNS

BACKGROUND OF THE INVENTION

1. Field of the Invention

The present invention relates to methods of forming semiconductor devices. More particularly, the present invention relates to methods of cleaning substrates after forming tungsten patterns.

2. Description of Related Art

As semiconductor devices become more highly integrated, design rules become gradually smaller. As the design rule is reduced, an interconnection of the semiconductor device decreases in width, causing an increase in resistance of the interconnection. Unfortunately, when the design rule is reduced, an interconnection such as a gate line or a bit line, which is composed of polysilicon or polycide, cannot possibly meet characteristics required for semiconductor devices.

To solve the problem of high resistance of interconnections, metals of low resistance are frequently used as interconnections for highly integrated semiconductor devices. Aluminum has been conventionally used for interconnections, while tungsten, a refractory metal, has been widely used for such interconnections as bit lines. Advantageously, when the bit line is composed of tungsten, a bit line contact plug is also composed of tungsten, which exhibits a reliable gap fill characteristic and does not increase an interface resistance between the bit line and the contact plug.

To form a tungsten plug in a semiconductor device, a contact hole is formed in an interlayer dielectric layer (ILD) to expose a portion of a lower conductive region. Tungsten is sufficiently stacked using CVD on the semiconductor substrate where the contact hole is formed, such that the contact hole is filled with tungsten. Then, a contact plug is formed by performing a tungsten chemical mechanical polishing (W-CMP) or an etchback process on the resultant substrate until the ILD is exposed. Also, when forming a tungsten interconnection pattern using a damascene process, the W-CMP is performed until the ILD is exposed.

In the event that the etchback process is carried out to form a tungsten pattern, metal polymers including tungsten are generated in large quantities and become attached to the substrate and the like. The metal polymers should be removed through a subsequent cleaning process. Similarly, when the W-CMP is carried out to form the tungsten pattern, oxidized slurry and tungsten residue usually remain on the substrate. The slurry residue should necessarily be removed because it may cause defects to the substrate.

In conventional methods, a cleaning process is carried out using a mixed solution of dilute ammonium hydroxide and dilute fluoric acid to remove the metal polymers and slurry residue after forming the tungsten pattern. A scrubbing process, which is a mechanical process, is performed on one or both sides of the substrate. However, the conventional cleaning process and scrubbing process are inefficient, and oxidized slurry residue and metal polymers cannot be removed to required thicknesses. As a result, the oxidized slurry residue and metal polymers remain on the substrate, thus inducing defects such as a single bit fail due to a short 21 between a capacitor contact plug 13 and a bit line 11, a bridge between bit lines, and the like, as shown in an electron micrograph of FIG. 1.

SUMMARY OF THE INVENTION

The present invention is therefore directed at solving the aforementioned problems, which occur during a cleaning process carried out after forming a tungsten pattern.

It is a feature of an embodiment of the present invention to provide a method of cleaning substrates capable of effectively removing residue attached to the substrates after forming tungsten patterns thereon during formation of semiconductor devices.

It is another feature of an embodiment of the present invention to provide a method of cleaning substrates after forming tungsten patterns thereon during formation of semiconductor devices such that damages to the tungsten pattern may be prevented.

In accordance with a feature of an embodiment of the present invention, a method for forming a semiconductor device is provided, the method including forming a tungsten layer on a substrate, etching the tungsten layer to form a tungsten pattern, and performing a cleaning process on the substrate having the tungsten pattern using a cleaning solution of a water solution containing 0.1 to 0.4 wt % fluoric acid and 0.5 to 2 wt % hydrogen peroxide.

The tungsten pattern may be a tungsten plug formed in an ILD, and may be formed by using chemical mechanical polishing (CMP).

In the present invention, the water solution preferably contains about 0.29 wt % fluoric acid and about 1 wt % hydrogen peroxide. The cleaning process is preferably performed at a normal temperature of 20 to 30° C. for 60 to 200 seconds.

The cleaning process of the present invention is carried out to remove oxidized slurry residue or metal polymers that are generated while forming a tungsten pattern, particularly during a conventional CMP or dry etching process. The cleaning solution for removing the oxidized slurry residue or metal polymers should include materials capable of removing not only the metal polymer, but also the oxidized slurry and metal oxides. In this sense, a mixture of hydrogen peroxide and fluoric acid may be reliably used as a cleaning solution.

In the cleaning solution of the present invention, a reaction between the mixture of hydrogen peroxide and fluoric acid and the metal polymers and oxidized slurry residue may be explained by the following equations. According to the equations, tungsten is either oxidized by hydrogen peroxide in the cleaning solution and dissolved into oxidized ions, or reacts with fluoric acid and evaporates in a state of a fluoric tungsten gas. In case of the oxidized slurry, after a reaction shown in Equation 4, the oxidized slurry may be removed in a state of $SiF_4$.

$$W + 3H_2O_2 \rightarrow WO_3 + 3H_2O \quad \text{[Equation 1]}$$

$$WO_3 + H_2O \rightarrow WO_4^{2-} + 2H^+ \quad \text{[Equation 2]}$$

$$WO_3 + 6HF \rightarrow WF_6(g) + 3H_2O \quad \text{[Equation 3]}$$

$$SiO_2 + 6HF \rightarrow H_2SiF_6 + 2H_2O \quad \text{[Equation 4]}$$

DETAILED DESCRIPTION OF THE INVENTION

This application relies for priority upon Korean Patent Application No. 2001-77809, filed on Dec. 10, 2001, entitled "Method of forming Semiconductor Device," the contents of which are incorporated herein by reference in their entirety.

The present invention will now be described more fully with reference to the accompanying drawings, in which preferred embodiments of the invention are shown.

In the present invention, a cleaning process is carried out to remove oxidized slurry residue or metal polymers that are generated while forming a tungsten pattern, especially during a conventional CMP or dry etching process. Accordingly, a cleaning solution is fabricated to contain hydrogen peroxide ranging from 0.1 to 4 wt % and fluoric acid ranging from 0.01 to 0.4 wt %. The fabricated cleaning solution is then applied to the substrate, and average thicknesses of the removed PE TEOS layer and the removed tungsten layer are measured, respectively.

A target thickness of the removed oxidized residue is equivalent to 200 Å of the PE TEOS layer, and a target thickness of the removed metal polymers is equivalent to 50 Å of the tungsten layer.

According to results of the measurements, use of the cleaning solution of the present invention containing fluoric acid of 0.1 to 0.4 wt % and hydrogen peroxide of 0.5 to 2 wt % allows simultaneous etching of the tungsten layer and the PE TEOS by as much as 50 and 200 angstroms, respectively.

When the cleaning process is performed using the water solution containing fluoric acid and hydrogen peroxide of the present invention, an etching temperature and cleaning time may be adjusted, such that the tungsten layer and the PE TEOS layer are etched to required thicknesses, respectively. However, even when using the cleaning solution of the present invention, the tungsten pattern formed on the substrate may be attacked according to the etching temperature and the cleaning time.

For example, while forming a tungsten plug by CMP or dry etching to remove all of a tungsten layer but the plug in an ILD, if a void or seam is already present in the plug, the cleaning solution may penetrate into the void or seam during the cleaning process, causing the void or seam to be enlarged. The severity and frequency of such a problem increases with an increase in cleaning time. For this reason, the cleaning time should be controlled and the amount of fluoric acid or hydrogen peroxide should not be reduced excessively.

However, when a weight percent of the fluoric acid or the hydrogen peroxide is high, an etched amount may vary sharply according to changes in temperature and time. Thus, it becomes more difficult to control the etched amounts. Accordingly, the amount of fluoric acid or hydrogen peroxide should not be increased excessively, either.

Figure 1:
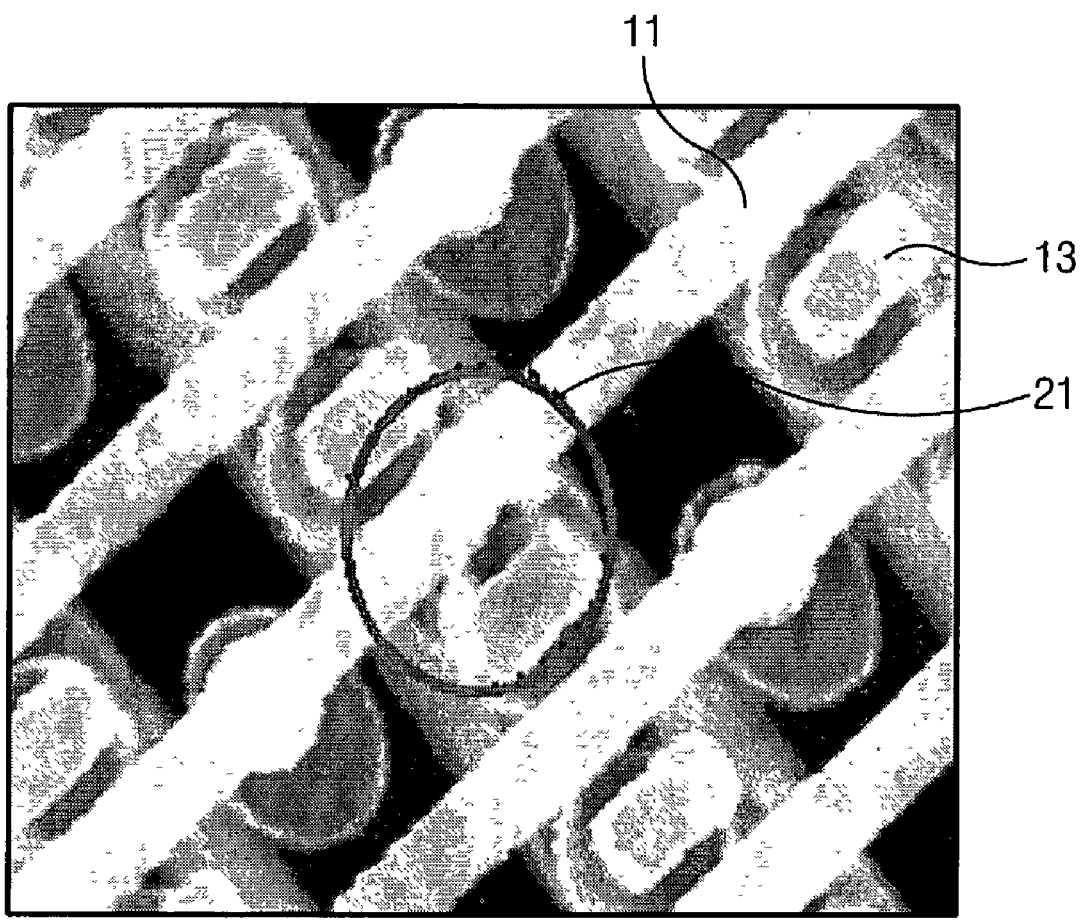
FIG. 1 illustrates an electron micrograph showing problems caused by a conventional cleaning method.
Figure 2:
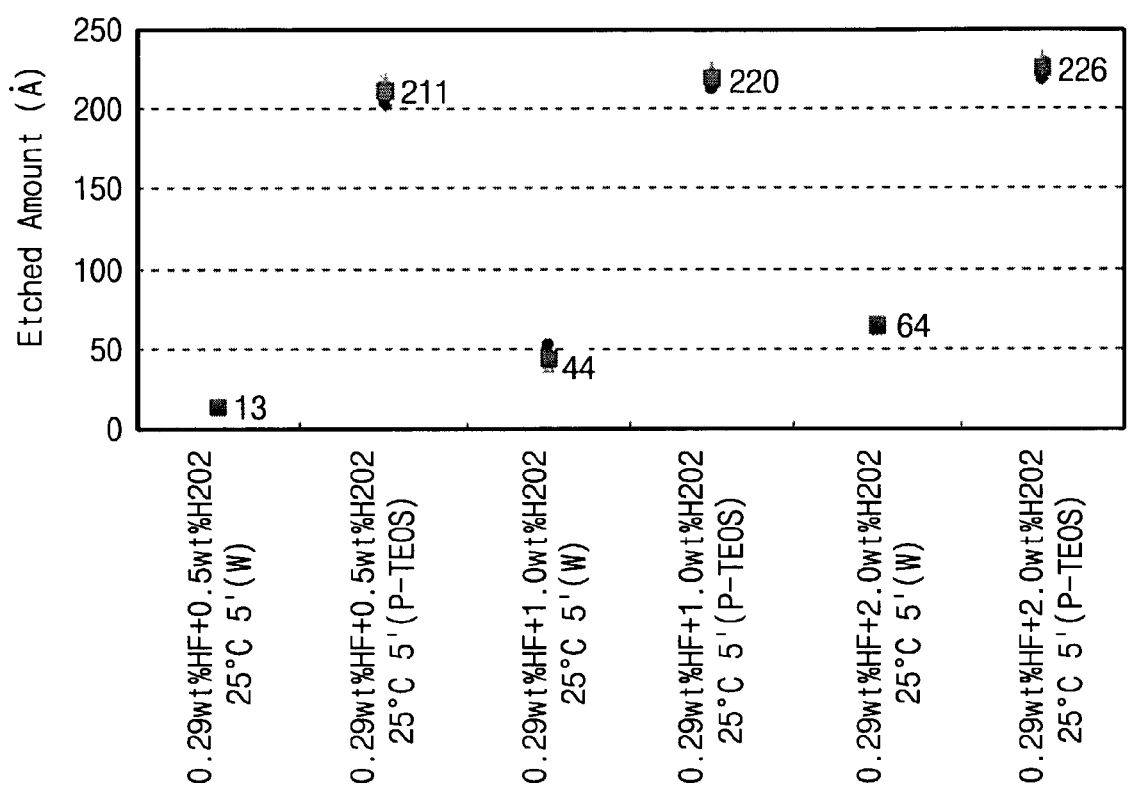
FIG. 2 illustrates a graph showing an etched thickness of each material layer according to a cleaning solution of the present invention.

FIG. 2 illustrates a graph showing etched amounts of a PE TEOS layer and a tungsten layer according to amounts of hydrogen peroxide and fluoric acid contained in a cleaning solution of the present invention.

As illustrated in FIG. 2, when a cleaning process was performed using a cleaning solution containing fluoric acid of about 0.29 wt % and hydrogen peroxide of about 1 wt % at a normal temperature of 25° C., a tungsten layer and a PE TEOS layer could be removed to required thicknesses in 5 seconds, which is a minimum length of time for controlling the etched amounts.

Figure 3:
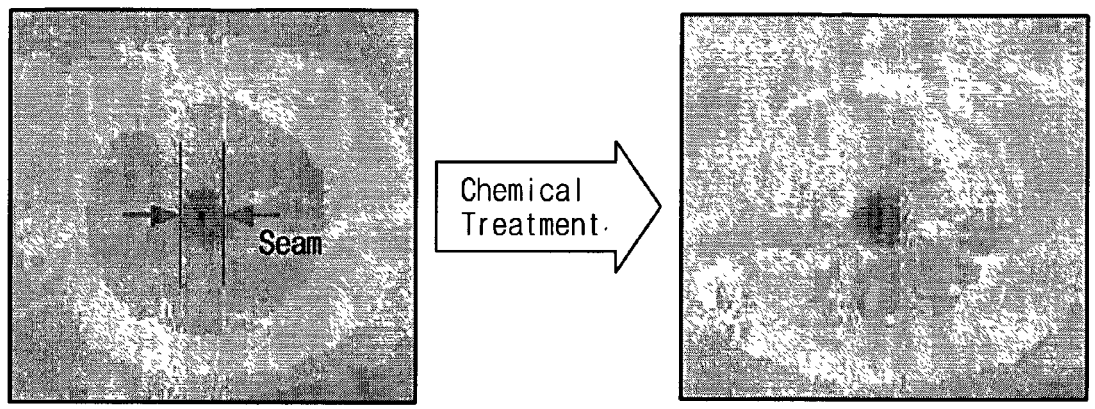
FIGS. 3 and 4 illustrate electron micrographs showing changes of a substrate before and after cleaning the substrate with the cleaning solution of the present invention.
Figure 4:
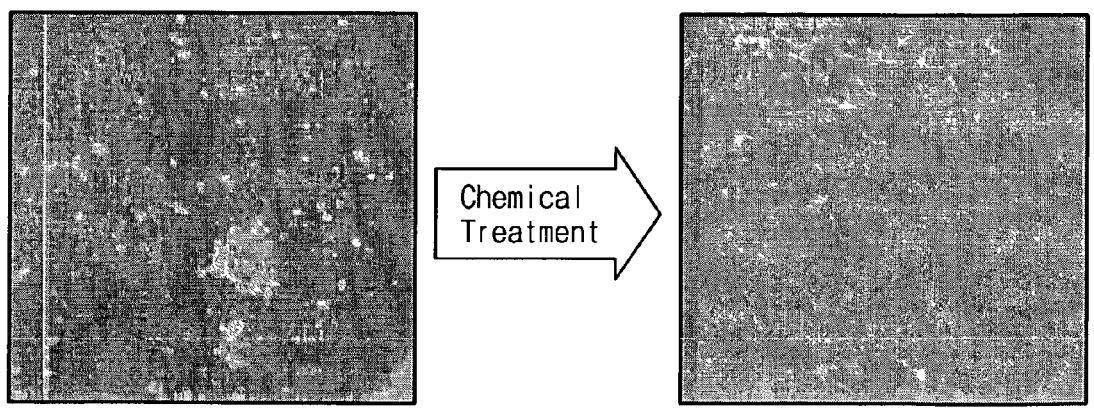

FIGS. 3 and 4 illustrate electron micrographs showing changes of a substrate after performing a cleaning process on the substrate using a cleaning solution of a deionized water solution containing fluoric acid of about 0.29 wt % and hydrogen peroxide of about 1 wt % at a normal temperature of 25° C. for 150 seconds. According to the results as illustrated in FIGS. 3 and 4 respectively, a seam formed at the plug is hardly enlarged, while at the same time, oxidized slurry residue remaining on the substrate after CMP is completely removed.

Figure 5:
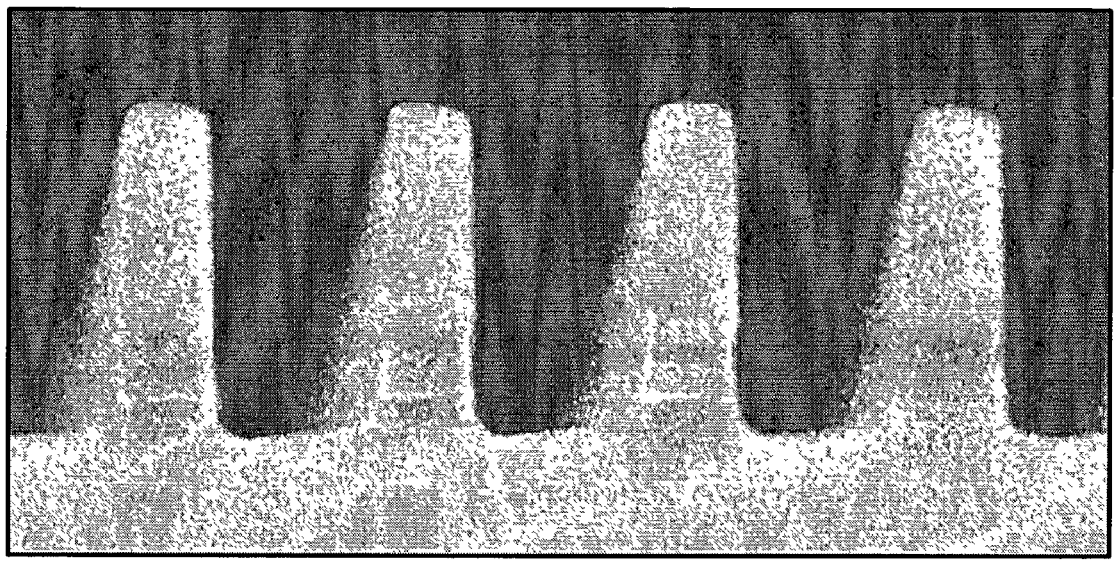
FIG. 5 illustrates an electron micrograph showing a profile of a tungsten pattern after being cleaned with the cleaning solution of the present invention.

FIG. 5 illustrates an electron micrograph showing a profile of a tungsten pattern formed on a substrate by a tungsten dry etch, which has been cleaned using a cleaning solution of a deionized water solution containing fluoric acid of about 0.29 wt % and hydrogen peroxide of about 1 wt % at a normal temperature of 25° C. for 150 seconds. As may be seen in FIG. 5, even if the cleaning process is carried out for a considerable time, the tungsten pattern is not seriously damaged by the cleaning solution.

According to the present invention, when a tungsten pattern is formed using CMP or dry etching, oxidized slurry residue and metal polymers remaining on a substrate may be effectively removed, thereby preventing the substrate from suffering damages during subsequent processes.

What is claimed is:

1. A method of forming a semiconductor device, comprising:
    forming a tungsten layer on a surface of a substrate;
    etching the tungsten layer to form a tungsten pattern using a chemical mechanical polishing; and
    performing a cleaning process, separately from etching, on the surface of the substrate having the tungsten pattern using a cleaning solution of a water solution containing 0.1 to 0.4 wt % fluoric acid and 0.5 to 2 wt % hydrogen peroxide to remove metal polymers and an oxidized slurry residue.

2. The method as claimed in claim 1, wherein the tungsten pattern is a tungsten plug formed in an ILD.

3. The method as claimed in claim 1, wherein the cleaning solution contains about 0.29 wt % fluoric acid and about 1 wt % hydrogen peroxide.

4. The method as claimed in claim 3, wherein the cleaning process is performed at a temperature of 20 to 30° C. for 60 to 200 seconds.

5. The method as claimed in claim 1, wherein the water solution is a deionized water solution containing 0.1 to 0.4 wt % fluoric acid and 0.5 to 2 wt % hydrogen peroxide.

6. The method as claimed in claim 1, wherein the cleaning solution consists essentially of a water solution containing 0.1 to 0.4 wt % fluoric acid and 0.5 to 2 wt % hydrogen peroxide.

7. The method as claimed in claim 1, wherein, during the cleaning process the tungsten pattern is exposed on the surface of the substrate.

* * * * *